US012334708B2

(12) United States Patent
Xu et al.

(10) Patent No.: US 12,334,708 B2
(45) Date of Patent: Jun. 17, 2025

(54) DRIVE CIRCUIT FOR DIRECT MODULATED LASER, AND DIRECT MODULATED OPTICAL TRANSMITTER

(71) Applicant: ACCELINK TECHNOLOGIES CO., LTD., Wuhan (CN)

(72) Inventors: Hongchun Xu, Wuhan (CN); Xueyong Zhang, Wuhan (CN); Bo Zhang, Wuhan (CN); Jing Wang, Wuhan (CN); Zhiqiang Chen, Wuhan (CN); Sen Hu, Wuhan (CN); Jie Zhou, Wuhan (CN)

(73) Assignee: ACCELINK TECHNOLOGIES CO., LTD., Wuhan (CN)

( * ) Notice: Subject to any disclaimer, the term of this patent is extended or adjusted under 35 U.S.C. 154(b) by 650 days.

(21) Appl. No.: 17/753,968

(22) PCT Filed: Dec. 13, 2019

(86) PCT No.: PCT/CN2019/125270
§ 371 (c)(1),
(2) Date: Mar. 18, 2022

(87) PCT Pub. No.: WO2021/051676
PCT Pub. Date: Mar. 25, 2021

(65) Prior Publication Data
US 2022/0337030 A1    Oct. 20, 2022

(30) Foreign Application Priority Data
Sep. 20, 2019  (CN) .......................... 201910893463.8

(51) Int. Cl.
*H01S 5/042* (2006.01)
*H04B 10/50* (2013.01)
(52) U.S. Cl.
CPC ......... *H01S 5/0427* (2013.01); *H04B 10/504* (2013.01)

(58) Field of Classification Search
CPC ... H04B 10/504; H01S 5/0427; H01S 5/0428; H01S 5/042
See application file for complete search history.

(56) References Cited

U.S. PATENT DOCUMENTS 4,307,469 A * 12/1981 Casper ............... H04B 10/0795
398/195
4,471,494 A *  9/1984 Keil ................... H04B 17/0087
398/185

(Continued)

FOREIGN PATENT DOCUMENTS

CN    104009805 A    8/2014
CN    104935777 A    9/2015
(Continued)

OTHER PUBLICATIONS

International Search Report issued in International Application No. PCT/CN2019/125270, mailed on Apr. 29, 2020.
Search Report issued in CN Application No. 201910893463.8.

*Primary Examiner* — Joshua King
(74) *Attorney, Agent, or Firm* — Knobbe Martens Olson & Bear LLP

(57) ABSTRACT

A drive circuit for a direct modulated laser and a direct modulated optical transmitter. The drive circuit includes a service data drive unit, a voltage configuration unit, a monitoring data modulation unit, and a monitoring current generation unit. Output terminals of the voltage configuration unit and the monitoring data modulation unit are connected to a same input terminal of the monitoring current generation unit. An output terminal of the service data drive unit is connected to a current sink interface of the monitoring current generation unit, and is suitable for connecting a direct modulated laser. In the technical solution, a low-speed monitoring data signal is mixed into an average optical power signal of a high-speed service data light wave from (Continued)

the direct modulated laser, then is extracted from the received optical signal by a remote optical receiver, enabling the drive circuit to be remotely monitored.

18 Claims, 4 Drawing Sheets

(56) References Cited

U.S. PATENT DOCUMENTS

| | | | | |
|---|---|---|---|---|
| 5,402,433 | A * | 3/1995 | Stiscia | H01S 5/06832 |
| | | | | 372/38.01 |
| 5,502,298 | A * | 3/1996 | Geller | H01S 5/06832 |
| | | | | 372/31 |
| 5,526,160 | A * | 6/1996 | Watanabe | H04B 10/43 |
| | | | | 398/137 |
| 6,055,252 | A * | 4/2000 | Zhang | H04B 10/564 |
| | | | | 372/6 |
| 6,597,485 | B1 | 7/2003 | Ikeuchi et al. | |
| 7,639,001 | B2 * | 12/2009 | Harres | H04B 3/32 |
| | | | | 324/750.3 |
| 7,706,685 | B2 * | 4/2010 | Stevens | H04J 14/00 |
| | | | | 398/45 |
| 10,680,715 | B1 * | 6/2020 | Nuttgens | H04B 10/50572 |
| 11,133,647 | B2 | 9/2021 | Yi et al. | |
| 2002/0114365 | A1 * | 8/2002 | Gilliland | H01S 5/042 |
| | | | | 372/38.02 |
| 2003/0063641 | A1 * | 4/2003 | Johnson | H01S 5/042 |
| | | | | 372/38.04 |
| 2005/0213622 | A1 * | 9/2005 | Diaz | H01S 5/0683 |
| | | | | 372/38.02 |
| 2009/0116847 | A1 * | 5/2009 | Duan | H04B 10/40 |
| | | | | 398/137 |
| 2012/0288274 | A1 * | 11/2012 | Li | H04B 10/0779 |
| | | | | 398/16 |
| 2014/0186046 | A1 * | 7/2014 | Gao | H01S 3/0014 |
| | | | | 372/38.03 |
| 2014/0241727 | A1 | 8/2014 | Lim et al. | |
| 2015/0162992 | A1 * | 6/2015 | Groepl | H04B 10/697 |
| | | | | 398/208 |
| 2016/0112139 | A1 | 4/2016 | Tanaka et al. | |
| 2020/0251883 | A1 | 8/2020 | Lin et al. | |
| 2021/0226413 | A1 * | 7/2021 | Yi | H01S 5/02212 |

FOREIGN PATENT DOCUMENTS

| | | | | |
|---|---|---|---|---|
| CN | 106921439 | A * | 7/2017 | ........... H01S 5/0085 |
| CN | 107658686 | A | 2/2018 | |
| CN | 208433971 | U | 1/2019 | |
| CN | 109417272 | A * | 3/2019 | ......... H01S 5/02212 |
| CN | 109638642 | A | 4/2019 | |
| CN | 110707520 | B | 1/2021 | |
| DE | 4290770 | T1 | 5/1994 | |
| EP | 1039665 | A2 | 9/2000 | |
| GB | 2269932 | B | 2/1995 | |
| JP | H11266049 | A * | 9/1999 | |
| JP | 2000269898 | A * | 9/2000 | ........... H04B 10/504 |
| KR | 100261233 | B1 * | 7/2000 | |
| KR | 20140017674 | A * | 2/2014 | |
| TW | 475305 | B * | 2/2002 | |
| WO | WO 92/17007 | A1 | 10/1992 | |

* cited by examiner

DRIVE CIRCUIT FOR DIRECT MODULATED LASER, AND DIRECT MODULATED OPTICAL TRANSMITTER

CROSS-REFERENCE

The present disclosure claims the benefit of, and priority to Chinese Patent Application No. 201910893463.8 filed on Sep. 20, 2019, the disclosure of which is hereby expressly incorporated by reference herein in its entirety.

TECHNICAL FIELD OF THE DISCLOSURE

The present disclosure belongs to the technical field of optical communications, and more particularly, relates to a drive circuit for a direct modulated laser and a direct modulated optical transmitter.

BACKGROUND

At present, direct modulated optical transmitters using direct modulated lasers as light-emitting devices have the advantages of high performance and low cost, and thus are widely used in optical fiber communication systems. The service data rate of the current high-speed direct modulated optical transmitter with a single wavelength channel is as high as tens of Gb/s, and the data rate in a range of 25 Gb/s to 56 Gb/s has been widely adopted. A high data rate is adopted for a single wavelength channel, which means that the optical wavelength channel carries a large amount of service data, and the importance and security of service and the scarcity of optical fiber resources are obvious. In order to ensure the reliable transmission of important services, it is necessary to carry out efficient operation and maintenance of optical transmission equipment including direct modulated optical transmitters. Commonly used methods include online performance monitoring and system network software management and the like.

Usually, the direct modulated optical transmitter will generate and continuously update low-speed monitoring data including identification code, current working status and digital diagnostic monitoring parameters, etc during performance monitoring. The access rate of monitoring data is not higher than 500 kb/s, much lower than machine's traffic rate. The access to this low-speed monitoring data also needs to occupy additional physical channels such as low-speed electrical links and electrical interfaces. Usually, monitoring data can only be accessed through a specially designed low-speed electrical interface in the local optical communication system where the optical transmitter is located. When the remote receiver of the optical transmitter needs to access the low-speed monitoring data generated by the direct modulated optical transmitter, since the direct modulated optical transmitter and the remote optical receiver are located in different network management systems, or are subject to different access rights, both ends cannot access the monitoring data of the remote optical communication equipment through the network management system, and the communication protocol of the established high-speed communication link does not support additional low-speed monitoring data transmission, resulting in that the remote monitoring of low-speed monitoring data needs newly established additional long-distance physical channels such as cables and electrical interfaces or optical fibers and optical interfaces, which leads to additional network construction costs, and even cannot be realized in some scenarios where optical fiber resources are limited.

In view of the above, overcoming the defects existing in the prior art is an urgent problem to be solved in the technical field.

SUMMARY

In view of the above defects or improvement requirements of the prior art, the present disclosure provides a drive circuit for a direct modulated laser and a direct modulated optical transmitter, and the purpose is that a low-speed monitoring data signal is aliased on the average optical power signal of the high-speed service data optical wave emitted by the direct modulated laser driven by the drive circuit. The remote optical receiver can obtain the low-speed monitoring data corresponding to the change of the average optical power signal intensity by extracting the low-frequency signal in the received optical signal, and does not affect the high-speed service data transmission, so that the drive circuit for the direct modulated laser has a long-range terminal monitoring function, thereby solving the technical problem that the existing direct modulated laser drive circuit does not have the signal processing function and the input interface for sending low-speed monitoring data, resulting in the low-speed monitoring data being unable to be accessed by the remote optical communication system.

In order to achieve the above object, according to one aspect of the present disclosure, there is provided a drive circuit for a direct modulated laser. The drive circuit for a direct modulated laser comprises a service data drive unit 1, a voltage configuration unit 2, a monitoring data modulation unit 3 and a monitoring current generation unit 4, output terminals of the voltage configuration unit 2 and the monitoring data modulating unit 3 are connected to a same input terminal of the monitoring current generation unit 4, and an output terminal of the service data drive unit 1 is connected to a current sink interface of the monitoring current generation unit 4, and the output terminal of the service data drive unit 1 is also suitable for connecting to the direct modulated laser 5;

an input terminal of the service data drive unit 1 is used for receiving a service data electrical signal, converting the service data electrical signal into a service data current signal, and then sending it to the direct modulated laser 5;

the voltage configuration unit 2 is used to adjust a maximum value of the input voltage of the monitoring current generation unit 4;

an input terminal of the monitoring data modulation unit 3 is used for receiving monitoring data, and modulating the monitoring data into a logic signal, wherein the logic signal and a voltage signal output by the voltage configuration unit 2 constitute a control signal together; and the monitoring current generation unit 4 is used to convert the control signal into a monitoring data current signal, and the monitoring data current signal flows through the direct modulated laser 5 and then flows into the current sink interface to drive the direct modulated laser 5 to emit light, so that the direct modulated laser 5 outputs an optical signal aliased with the monitoring data and service data, thereby realizing remote monitoring.

In addition, the drive circuit further comprises an isolation inductor L1, one end of the isolation inductor L1 is connected to the output terminal of the service data drive unit 1, and the other end of the isolation inductor L1 is connected to the current sink interface of the monitoring current generation unit 4; and the isolation inductor L1 is used to isolate the service data electrical signal to avoid leakage.

In addition, the monitoring data modulation unit 3 comprises an inversion buffer U1 and a MOS transistor Q1;

an input terminal of the inversion buffer U1 is connected to the input terminal of the monitoring data modulation unit 3, an output terminal of the inversion buffer U1 is connected to a gate of the MOS transistor Q1, and a drain of the MOS transistor Q1 is connected to one input terminal of the monitoring current generation unit 4, and a source of the MOS transistor Q1 is grounded.

In addition, the monitoring current generation unit 4 comprises an operational amplifier U2, a MOS transistor Q2 and a resistor R1;

an output terminal of the operational amplifier U2 is connected to a gate of the MOS transistor Q2, a drain of the MOS transistor Q2 is configured as the current sink interface, and a source of the MOS transistor Q2 is connected to a first end of the resistor R1, and a second end of the resistor R1 is grounded;

One of input terminals of the operational amplifier U2 is connected to the output terminals of the voltage configuration unit 2 and the monitoring data modulation unit 3 at the same time, and the other input terminal of the operational amplifier U2 is connected to the first terminal of the resistor R1.

In addition, the voltage configuration unit 2 comprises a voltage source VDAC, a resistor R2 and a resistor R3;

a positive electrode of the voltage source VDAC is connected to a first end of the resistor R2, a second end of the resistor R2 is connected to a first end of the resistor R3, and both a second end of the resistor R3 and a negative electrode of the voltage source VDAC are grounded; and a first end of the resistor R3 is connected to one input terminal of the monitoring current generation unit 4.

In addition, the service data drive unit 1 comprises a triode QA, a triode QB and a current source Imod;

a base of the triode QA is connected to a first input terminal of the service data drive unit 1, a collector of the triode QA is connected to a first output terminal of the service data drive unit 1, an emitter of the triode QA is connected to a first end of the current source Imod, and a second end of the current source Imod is grounded; and a base of the triode QB is connected to a second input terminal of the service data drive unit 1, a collector of the triode QB is connected to a second output terminal of the service data drive unit 1, and an emitter of the triode QB is connected to the first end of the current source Imod.

In addition, the service data drive unit 1 further comprises a voltage source Va, an inductor LA and a resistance RA;

a positive electrode of the voltage source Va is connected to a first end of the inductor LA, a negative electrode of the voltage source Va is grounded, a second end of the inductor LA is connected to the collector of the transistor QA, and a first end of the resistor RA is connected to the positive electrode of the voltage source Va, and a second end of the resistor RA is connected to the collector of the triode QA.

In addition, the service data drive unit 1 further comprises a voltage source Vb, an inductor LB and a resistance RB;

a positive electrode of the voltage source Vb is connected to a first end of the inductor LB, a negative electrode of the voltage source Vb is grounded, a second end of the inductor LB is connected to the collector of the transistor QB, and a first end of the resistor RB is connected to the positive electrode of the voltage source Vb, and a second end of the resistor RB is connected to the collector of the transistor QB.

In addition, a signal rate of the service data is larger than 100 Mb/s, and the signal rate of the monitoring data is not larger than 500 kb/s.

According to another aspect of the present disclosure, a direct modulated optical transmitter is provided. The direct modulated optical transmitter comprises a direct modulated laser 5 and the drive circuit of the present disclosure. The direct modulated laser 5 is connected to the output terminal of the service data drive unit 1, and the direct modulated laser 5 outputs an optical signal aliased with the monitoring data and the service data.

In general, compared with the prior art, the above technical solutions conceived by the present invention have the following beneficial effects: the present invention provides a drive circuit for a direct modulated laser and a direct modulated optical transmitter, and the drive circuit comprises a service data driver unit, a voltage configuration unit, a monitoring data modulation unit and a monitoring current generation unit, wherein output terminals of the voltage configuration unit and the monitoring data modulation unit are connected to the same input terminal of the monitoring current generation unit, and the output terminal of the service data drive unit is connected to a current sink interface of the monitoring current generation unit, and the output terminal of the service data drive unit is also suitable for connecting to a direct modulated laser. In the present disclosure, the monitoring data modulation unit is used to receive the monitoring data, modulate the monitoring data, and alias the current signal corresponding to the monitoring data with the current signal corresponding to the service data through the current sink interface, thereby driving the direct modulated laser to emit an average optical power signal of the high-speed service data light wave aliased with a low-speed monitoring data signal. And then, the remote optical receiver can obtain the low-speed monitoring data corresponding to the change of the average optical power signal intensity by extracting the low-frequency signal in the received optical signal, and high-speed service data transmission is not affected, thereby realizing the effect that the drive circuit of the direct modulated laser has a remote monitoring function.

BRIEF DESCRIPTION OF THE DRAWINGS

In order to describe the technical solutions of the embodiments of the present disclosure more clearly, the accompanying drawings that need to be used in the embodiments of the present disclosure will be introduced briefly hereinafter. Obviously, the drawings described below are only some embodiments of the present disclosure, and other drawings can also be obtained from these drawings by those of ordinary skill in the art, without creative effort.

DETAILED DESCRIPTION

Figure 1:
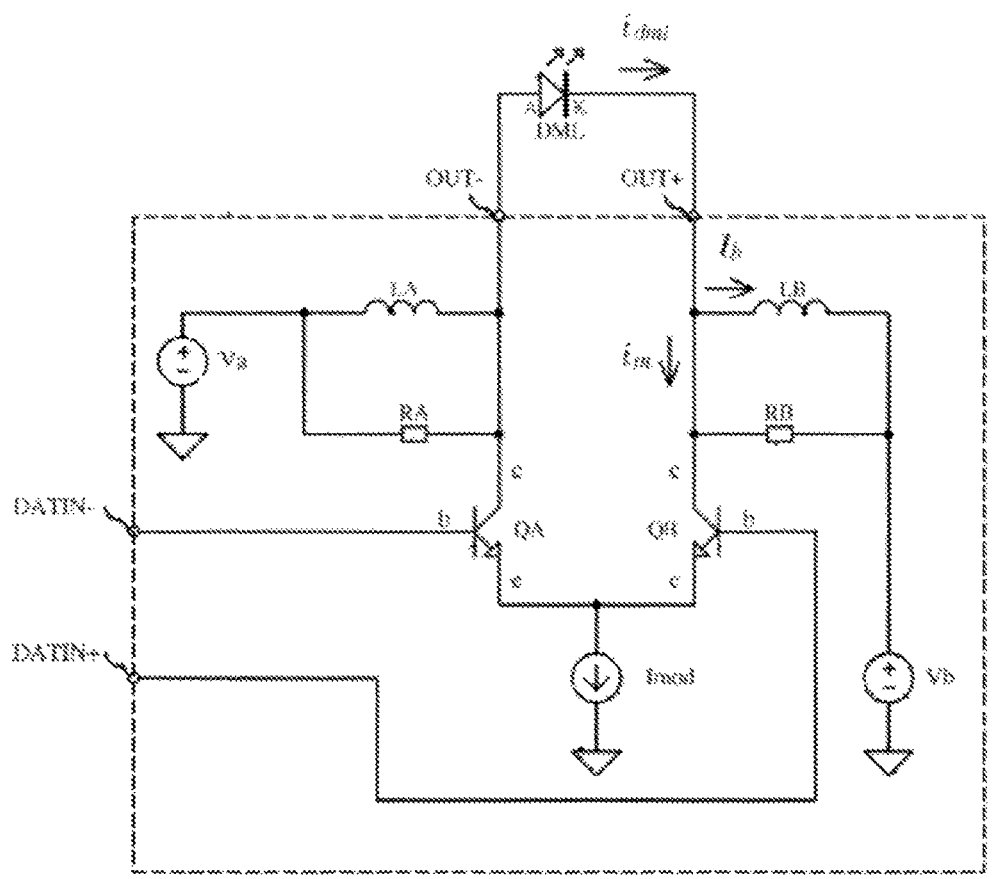
FIG. 1 is a schematic structural diagram of a first drive circuit of a direct modulated laser provided by an embodiment of the present disclosure.

In order to make the objects, technical solutions and advantages of the present invention clearer, the present disclosure will be further described in detail below with reference to the accompanying drawings and embodiments. It should be understood that the specific embodiments described herein are only used to explain, but not to limit the present disclosure.

In the description of the present disclosure, the orientation or positional relationship indicated by the terms "inner", "outer", "longitudinal", "lateral", "upper", "lower", "top", "bottom", etc. is based on the orientations or positional relationships shown in the drawings and is only for the convenience of describing the present disclosure rather than requiring the present disclosure to be constructed and operated in a specific orientation, and therefore should not be construed as limiting the present disclosure.

In addition, the technical features involved in the various embodiments of the present disclosure described below can be combined with each other as long as they do not conflict with each other.

Figure 4:
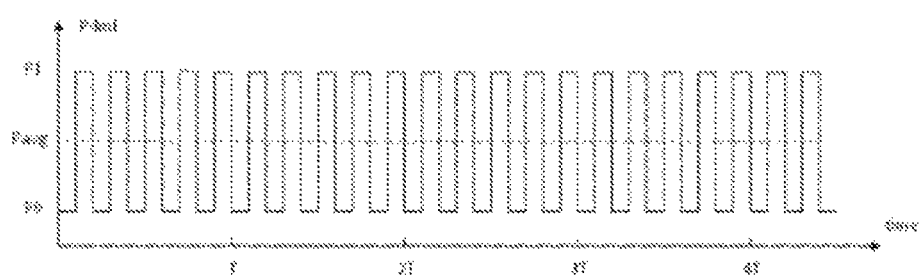
FIG. 4 is a schematic waveform diagram of a service data optical signal sent by a direct modulated laser provided by an embodiment of the present disclosure.

In practical application scenarios, the drive circuit shown in FIG. 1 is generally used to drive a direct modulated laser to emit optical signals according to service data. In FIG. 1, the drive circuit comprises a service data drive unit and a direct modulated laser, and a voltage signal corresponding to the high-speed service data is input from DATIN+ and DATIN− electrical interfaces of the service data drive unit, and converted into a modulated current signal im carrying high-speed data information, then superimposed a DC bias current Ib, and finally, output from OUT+ and OUT− electrical interfaces of the service data drive unit to drive the direct modulated laser to emit high-speed service optical signals with stable average optical power, whose waveform is as shown in FIG. 4. Since the direct modulated laser drive circuit does not have an input interface and processing and sending function for low-speed monitoring data, when the direct modulated optical transmitter and the remote optical communication system are connected by only single-wavelength optical fibers, there is no additional physical channel such as directly connected cable or optical fiber therebetween, so that the monitoring data of the direct modulated optical transmitter cannot be directly accessed by the remote terminal optical communication system. Moreover, because it does not have the signal processing function and input interface for sending low-speed monitoring data, the drive circuit of the existing direct modulated laser cannot be remotely monitored while sending high-speed service data optical signals.

Embodiment 1

Figure 2:
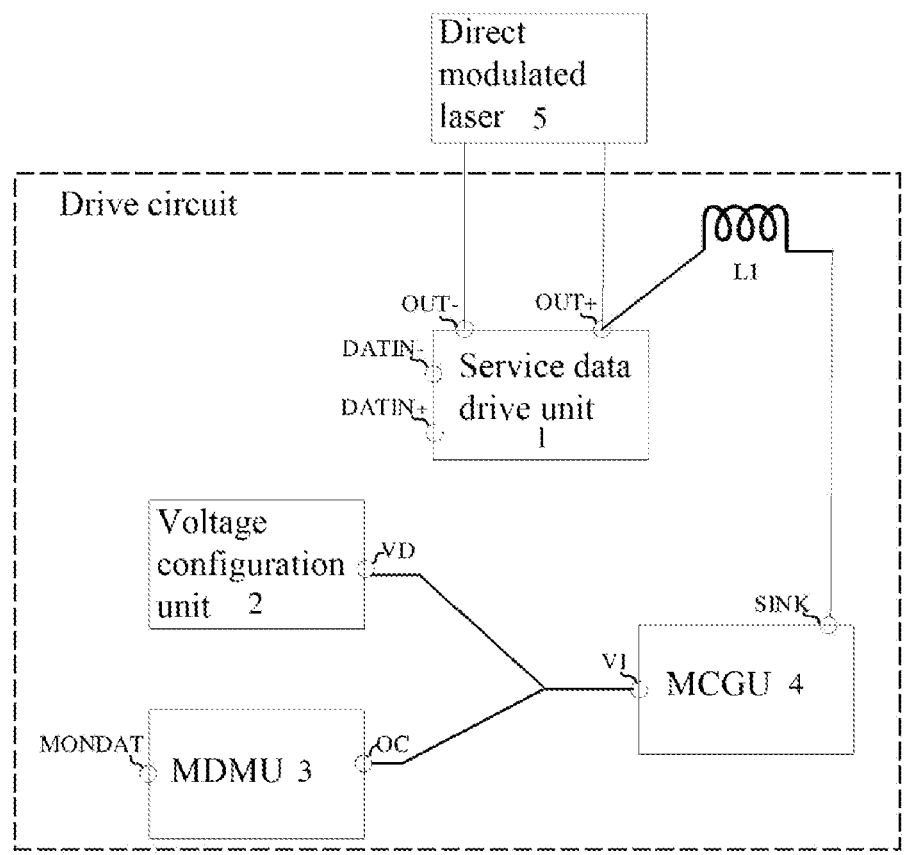
FIG. 2 is a schematic structural diagram of a second drive circuit of a direct modulated laser provided by an embodiment of the present disclosure.

In order to solve the aforementioned problems, the drive circuit is improved in this embodiment. Referring to FIG. 2, the drive circuit for a direct modulated laser according to this embodiment comprises a service data drive unit 1, a voltage configuration unit 2, a monitoring data modulation unit (MDMU) 3 and a monitoring current generation unit (MCGU) 4, wherein output terminals of the voltage configuration unit 2 and the monitoring data modulation unit 3 are connected to the same input terminal (VI) of the monitoring current generation unit 4, and an output terminal (OUT+) of the service data drive unit 1 is connected to a current sink interface of the monitoring current generation unit 4, and the output terminals (OUT− and OUT+) of the service data drive unit 1 are also suitable for connecting to the direct modulated laser 5.

In practical use, the input terminals (DATIN− and DATIN+) of the service data drive unit 1 are used to receive service data electrical signals and convert the service data electrical signals into service data current signals (im in FIG. 3), and then send it to the direct modulated laser 5; the voltage configuration unit 2 is used to adjust the maximum value of the input voltage VI of the monitoring current generation unit 4; an input terminal (MONDAT) of the monitoring data modulation unit 3 is used for receiving monitoring data, and modulating the monitoring data into a logic signal, wherein the logic signal and the voltage signal output by the voltage configuration unit 2 constitute a control signal together; the monitoring current generation unit 4 is used to convert the control signal into a monitoring data current signal (corresponding to iD in FIG. 3), and the monitoring data current signal flows through the direct modulated laser 5 and then flows into the monitoring current generation unit 4 through the current sink interface (SINK) to drive the direct modulated laser 5 to emit light, so that the direct modulated laser 5 outputs an optical signal aliased with monitoring data and service data, thereby realizing remote monitoring.

The monitoring data here refers to the low-speed monitoring data generated and continuously updated when the direct modulated optical transmitter is being monitored during the operation of the direct modulated optical transmitter, including identification codes, current working status, and digital diagnostic monitoring parameters. The service data here refers to the valid data that carries the communication service sent by the direct modulated optical transmitter.

The signal rate of the service data is larger than 100 Mb/s, and the signal rate of the monitoring data is not larger than 500 kb/s, that is, the signal rate of the service data is at high speed, and the signal rate of the monitoring data is at low speed.

The service data current signal is converted based on high-speed service data and carries information corresponding to the high-speed service data, and the monitoring data current signal is converted based on low-speed monitoring data and carries information corresponding to the low-speed monitoring data.

In the present disclosure, the monitoring data modulation unit 3 is used for receiving the monitoring data and modulating the monitoring data, and the monitoring current generation unit 4 generates the current signal corresponding to the monitoring data and aliases, through the current sink interface, the current signal corresponding to the monitoring data with the current signal flowing through the direct modulated laser 5. As a result, the low-speed monitoring data signal is aliased on the average optical power signal of the high-speed service data light wave emitted by the direct modulated laser 5, and the remote optical receiver extracts the low-frequency signal in the received optical signal to obtain the low-speed monitoring data corresponding to the variation of the average optical power signal intensity without affecting the high-speed service data transmission, thereby realizing the effect that the drive circuit of the direct modulated laser has a remote monitoring function.

The drive circuit further comprises an isolation inductor L1, wherein one end of the isolation inductor L1 is connected to one output terminal (OUT+) of the service data drive unit 1, and the other end of the isolation inductor L1 is connected to the current sink interface of the monitoring current generation unit 4; and the isolation inductor L1 is used to isolate the service data electrical signal to avoid leakage. The isolation inductor L1 is a high-frequency isolation inductor.

In an optional embodiment, both ends of the isolation inductor L1 are respectively connected to the output interface OUT+ of the service data drive unit 1 and the current sink interface SINK of the monitoring current generation unit 4, and the isolation inductor L1 both allows the flowing through of modulation current iD corresponding to the low-speed monitoring data generated by the monitoring current generation unit 4, and the isolation of the high-speed service data signal generated by the service data drive unit 1, and moreover, the low-speed current signal imon flowing through the isolation inductor L1 is equal to the modulation current iD corresponding to the low-speed monitoring data generated by the monitoring current generation unit 4.

Figure 3:
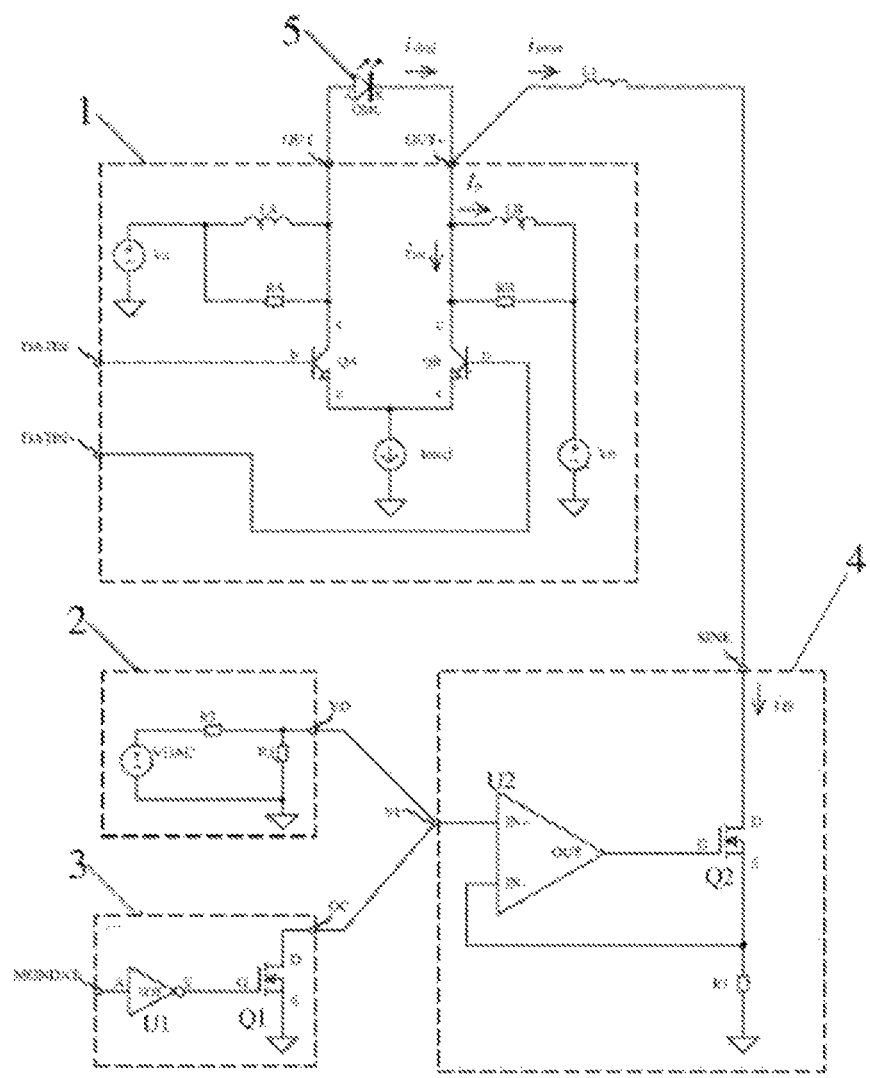
FIG. 3 is a schematic structural diagram of a third drive circuit of a direct modulated laser provided by an embodiment of the present disclosure.

Referring to FIG. 3, the voltage configuration unit 2 comprises a voltage source VDAC, a resistor R2 and a resistor R3; a positive electrode of the voltage source VDAC is connected to a first end of the resistor R2, and a second end of the resistor R2 is connected to a first end of the resistor R3, a second end of the resistor R3 and a negative electrode of the voltage source VDAC are both grounded; the first end of the resistor R3 is connected to an input terminal (VI) of the monitoring current generation unit 4. That is, the first end of the resistor R3 is connected to the output terminal VD of the voltage configuration unit 2, and the output terminal VD of the voltage configuration unit 2 is connected to the input terminal VI of the monitoring current generation unit 4.

Referring to FIG. 3, an electrical interface VD is provided on the right side of the voltage configuration unit 2, and the electrical interface VD is connected to the left input interface VI of the monitoring current generation unit 4. The resistor R2 and the resistor R3 form a voltage distribution network, and the voltage source VDAC sets the maximum value (VDAC) of the input DC voltage of the voltage distribution network.

When the voltage configuration unit 2 works independently, the DC voltage output by the electrical interface VD based on the voltage distribution network is VDAC*R3/(R2+R3). The output voltage of the electrical interface VD can be changed by changing either the voltage value VDAC of the voltage source VDAC, the resistance value of resistor R2, or the resistance value of the resistor R3.

The monitoring data modulation unit 3 comprises an inversion buffer U1 and a MOS transistor Q1; an input terminal of the inversion buffer U1 is connected with the input terminal (MONDAT) of the monitoring data modulation unit 3, and an output terminal of the inversion buffer U1 is connected to a gate of the MOS transistor Q1, a drain of the MOS transistor Q1 (the drain of the MOS transistor Q1 is connected to the output terminal OC of the monitoring data modulation unit 3) is connected to the one input terminal (VI) of the monitoring current generation unit 4, and a source of the MOS transistor Q1 is grounded. The MOS transistor Q1 may be an N-channel MOS transistor.

Referring to FIG. 3, the monitoring data modulation unit 3 is provided with the monitoring data input interface MONDAT on its left side and the output interface OC on its right side, and the electrical signal corresponding to the low-speed monitoring data is sent into the monitoring data modulation unit 3 through the input interface MONDAT for modulation, thereby obtaining a low-speed modulation signal, and the low-speed modulation signal is output from the output interface OC which is connected to the left input interface VI of the monitoring current generation unit 4.

The inverse buffer U1 is used to logically shape the input low-speed monitoring data electrical signal, and the G electrode (gate) of the MOS transistor Q1 receives the shaped low-speed monitoring binary signal to control the on or off between the D electrode (drain) and the S electrode (source). When the low-speed monitoring data signal MONDAT is High, the D electrode and S electrode of the MOS transistor Q1 are disconnected, so that the output interface OC is disconnected from a signal ground, and at this time, the output interface OC outputs a high level; when the low-speed monitoring data signal MONDAT is Low, the D electrode and the S electrode of the MOS transistor Q1 are turned on, making the output interface OC short-circuiting with the signal ground, and at this time, the output interface OC outputs a low level, that is, the output interface OC of the monitoring data modulation unit 3 outputs a logic signal in the form of high and low levels.

Figure 5:
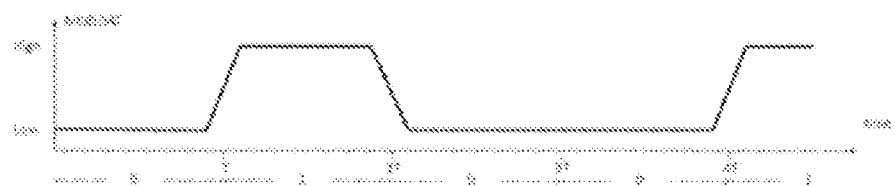
FIG. 5 is a schematic waveform diagram of monitoring data provided by an embodiment of the present disclosure.

In an actual application scenario, low-speed monitoring data will be generated inside the direct modulated optical transmitter, and will be continuously updated. The monitoring data comprises identification codes, current working status or digital diagnostic monitoring parameters, etc. The waveform of the monitoring data MONDAT, as shown in FIG. 5, consists of a time series including high (High) levels and low (Low) levels. Referring to FIG. 3, a monitoring data input interface MONDAT is provided on the left side of the monitoring data modulation unit 3, and is used to receive monitoring data from a direct modulated optical transmitter.

Figure 6:
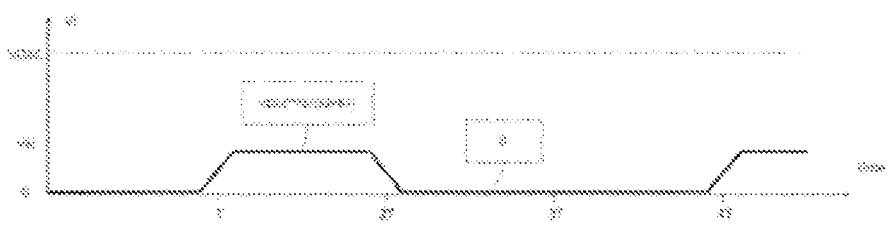
FIG. 6 is a schematic diagram of a voltage waveform received by an input terminal VI of a monitoring current generation unit provided by an embodiment of the present disclosure.

In the present embodiment, because the electrical interface VD of the voltage configuration unit 2 and the output interface OC of the monitoring data modulation unit 3 are all connected with the left input interface VI of the monitoring current generation unit 4, all the input signal VI of the monitoring current generation unit 4 is controlled by the low-speed monitoring data signal MONDAT of the monitoring data modulating unit 3, and the waveform of the low-speed control voltage input signal VI is shown in FIG. 6. When the low-speed monitoring data signal MONDAT is High, the signal voltage received by the input interface VI is VDAC*R3/(R2+R3). When the low-speed monitoring data signal MONDAT is Low, the signal voltage received by the input interface VI is 0.

The monitoring current generation unit 4 comprises an operational amplifier U2, a MOS transistor Q2 and a resistor R1; an output terminal of the operational amplifier U2 is connected to a gate of the MOS transistor Q2, a drain of the MOS transistor Q2 is configured as the current sink interface SINK, a source of the MOS transistor Q2 is connected to a first end of the resistor R1, and a second end of the resistor R1 is grounded; one of the input terminals of the operational amplifier U2 (non-inverting input) is simultaneously connected to the voltage configuration unit 2 and the monitoring data modulation unit 3, and the other input terminal (inverting input) of the operational amplifier U2 is connected to the first terminal of the resistor RE The MOS transistor Q2 may be an N-channel MOS transistor.

Figure 7:
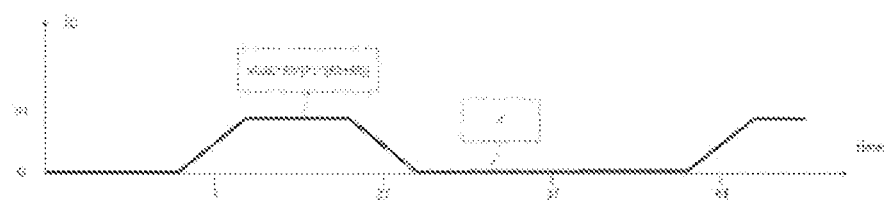
FIG. 7 is a schematic diagram of an output signal of modulation current iD (monitoring data current signal) corresponding to monitoring data provided by an embodiment of the present disclosure.

With referring to FIG. 3, the operational amplifier U2 constitutes a voltage follower, the OUT electrode of the operational amplifier U2 outputs a voltage, and controls the channel between the D electrode and the S electrode of the MOS transistor Q2 to conduct, so that the incoming current iD flowing into the current sink interface SINK first flows through the D electrode and S electrode of the MOS transistor Q2, and then flows through the resistor R1 and the signal ground. Therefore, the modulation current iD corresponding to the low-speed monitoring data is equal to the voltage value of the input interface VI divided by the resistance value of the resistor R1, wherein the waveform of the modulation current iD corresponding to the low-speed monitoring data is as shown in FIG. 7.

Further, the service data drive unit 1 comprises a triode QA, a triode QB and a current source Imod; a base of the triode QA is connected to a first input terminal (DATIN−) of the service data drive unit 1, a collector of the triode QA is connected to a first output terminal (OUT−) of the service data drive unit 1, an emitter of the transistor QA is connected to a first terminal of the current source Imod, and a second terminal of the current source Imod is grounded; a base of the transistor QB is connected to a second input terminal (DATIN+) of the service data drive unit 1, a collector of the transistor QB is connected to a second output terminal (OUT+) of the service data drive unit 1, and an emitter of the transistor QB is connected to the first end of the current source Imod.

In addition, the service data drive unit 1 further comprises a voltage source Va, an inductor LA and a resistor RA; a positive electrode of the voltage source Va is connected to a first end of the inductor LA, a negative electrode of the voltage source Va is grounded, and a second end of the inductor LA is connected to the collector of the transistor QA, a first end of the resistor RA is connected to the positive electrode of the voltage source Va, and a second end of the resistor RA is connected to the collector of the transistor QA.

The service data drive unit 1 further comprises a voltage source Vb, an inductor LB and a resistor RB; a positive electrode of the voltage source Vb is connected to a first end of the inductor LB, a negative electrode of the voltage source Vb is grounded, a second end of the inductor LB is connected to the collector of the transistor QB, a first end of the resistor RB is connected to the positive electrode of the voltage source Vb, and a second end of the resistor RB is connected to the collector of the transistor QB.

With referring to FIG. 3, the service data drive unit 1 is provided with a high-speed data input interface DATIN+ (corresponding to the second input terminal described above) and DATIN− (corresponding to the first input terminal described above), and a drive current output interface OUT+(corresponding to the second output terminal described above) and OUT− (corresponding to the first output terminal described above); the high-speed service data electrical signal passes through the input interfaces DATIN+ and DATIN− and reaches the service data drive unit 1 to be processed; and the output interfaces OUT− and OUT+ of the service data drive unit 1 are respectively connected with the A electrode and the K electrode of the direct modulated laser 5.

In this embodiment, the transistor QA and the transistor QB form a high-speed switch pair; the current source Imod is used to set the amplitude of the high-speed service data modulation current signal; the resistor RA is used as the near-end AC load resistor of the c-electrode (collector) of the transistor QA; the resistance RB is used as the near-end AC load resistor of the c-electrode (collector) of the triode QB, and the corresponding modulation current of the high-speed service data flowing through the direct modulated laser 5 is im; the inductor LA and the inductor LB are used to provide a DC bias current path for the direct modulated laser 5, and the corresponding DC bias current flowing through the direct modulated laser 5 is Ib; and the DC voltage Va of the voltage source Va is higher than the DC voltage Vb of the voltage source Vb. Furthermore, by setting the voltage values of the voltage source Va and the voltage source Vb respectively, the A electrode and the K electrode of the direct modulated laser 5 are provided with a forward voltage bias, and c-electrode of the triode QA and the c-electrode of the triode QB are provided with a forward voltage bias.

The high-speed data signal (service data) is differentially input from the left interfaces DATIN+ and DATIN− of the service data drive unit 1 to control that the respective c and e (emitter) electrodes of the triode QA and the triode QB are alternately turned on or off at a high speed, and then control a pair of triodes to have high-speed current flowing into or disconnected with the respective c electrodes, and the c electrode of the triode QB is connected to the drive current output interface OUT+, and is connected to the K electrode of the direct modulated laser 5 to provide a high-speed switching path for the service data modulation current im flowing through the direct modulated laser 5, thereby driving the direct modulated laser 5.

Figure 8:
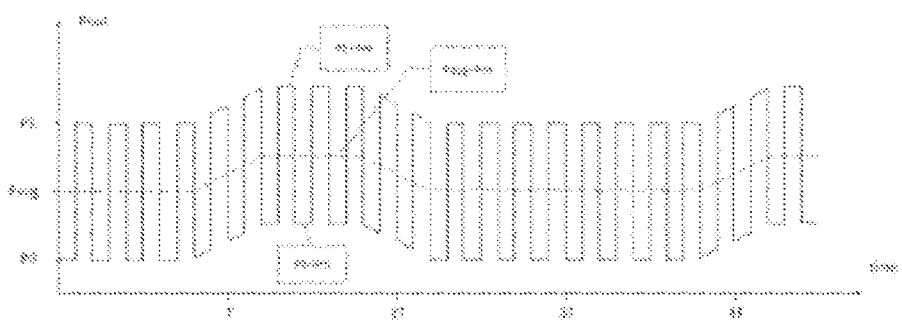
FIG. 8 is a schematic diagram of an optical signal of aliased monitoring data and service data according to an embodiment of the present disclosure.

The A electrode and the K electrode of the direct modulated laser 5 are respectively connected with the output interfaces OUT− and OUT+ of the service data drive unit 1, and the K electrode of the directly modulation laser 5 is also connected with the left end of the isolation inductor L1; the direct modulated laser 5 emits an optical signal under the drive of the total current idml flowing through its A electrode and K electrode, and the current at the output interface OUT+ of the service data drive unit 1 is idml=Ib+im+imon, where Ib is the DC bias current of the laser, im is the modulation current of the high-speed service data, and imon is equal to the modulation current iD corresponding to the low-speed monitoring data. Therefore, the total current idml flowing through the direct modulated laser 5 simultaneously comprises the high-speed service data signal and the low-speed monitoring data signal, so that the average optical power signal of the high-speed service data light wave emitted by the direct modulated laser 5 is aliased with the low-speed monitoring data signal, wherein the waveforms of the optical signal aliased the low-speed monitoring data and the high-speed service data are as shown in FIG. 8. When the low-speed monitoring data signal is at a low (Low) level, the average optical power of the light-emitting signal remains unchanged. When the low-speed monitoring data signal is at a high (High) level, the average optical power of the light-emitting signal is controlled to increase, and the low-speed monitoring data corresponding to the change of the average optical power signal intensity can be obtained by extracting the low-frequency signal of the received light using the remote optical receiver, and the effect that the drive circuit of the direct modulated laser 5 has a remote monitoring function is realized.

Embodiment 2

In a practical application scenario, the drive circuit of Embodiment 1 can be used to make a direct modulated optical transmitter, so that the direct modulated optical transmitter has a remote monitoring function. In this embodiment, combined with the preceding Embodiment 1, a direct modulated optical transmitter is provided. The direct modulated optical transmitter comprises a direct modulated laser 5 and the drive circuit described in Embodiment 1. The direct modulated laser 5 is connected to the output terminal of the service data drive unit 1. The tunable laser 5 outputs an optical signal aliased with the monitoring data and the service data. After receiving the signal, the remote receiver can obtain the low-speed monitoring corresponding to the change of the average optical power signal intensity by extracting the low-frequency signal in the received optical signal, and does not affect the high-speed service data transmission, so as to realize the effect of remote monitoring function of the direct modulated optical transmitter.

In a practical application scenario, the direct modulated optical transmitter further comprises a microprocessor, wherein the microprocessor is used to monitor the internal working state of the direct modulated optical transmitter in real time, so as to generate monitoring data, and send the monitoring data to the monitoring data modulation unit.

For the specific structure and implementation principle of the drive circuit for a direct modulated laser, please refer to Embodiment 1, which will not be repeated here.

Those skilled in the art can easily understand that the above are only preferred embodiments of the present invention, and are not intended to limit the present invention. Any modifications, equivalent replacements and improvements made within the spirit and principles of the present invention, etc. should be included within the protection scope of the present invention.

What is claimed is:

1. A drive circuit for a direct modulated laser, wherein the drive circuit for a direct modulated laser comprises a service data drive unit, a voltage configuration unit, a monitoring data modulation unit and a monitoring current generation unit, output terminals of the voltage configuration unit and the monitoring data modulation unit are connected to a same input terminal of the monitoring current generation unit, and an output terminal of the service data drive unit is connected to a current sink interface of the monitoring current generation unit, and the output terminal of the service data drive unit is also suitable for connecting the direct modulated laser;

an input terminal of the service data drive unit is used for receiving a service data electrical signal, converting the service data electrical signal into a service data current signal, and then sending it to the direct modulated laser;

the voltage configuration unit is used to adjust a maximum value of an input voltage of the monitoring current generation unit;

an input terminal of the monitoring data modulation unit is used for receiving monitoring data, and modulating the monitoring data into a logic signal, wherein the logic signal and a voltage signal output by the voltage configuration unit constitute a control signal together; and the monitoring current generation unit is used to convert the control signal into a monitoring data current signal, and the monitoring data current signal flows through the direct modulated laser and then flows into the current sink interface to drive the direct modulated laser to emit light, so that the direct modulated laser outputs an optical signal aliased with the monitoring data and service data, thereby realizing remote monitoring.

2. The drive circuit of claim 1, wherein the drive circuit further comprises an isolation inductor L1, one end of the isolation inductor L1 is connected to the output terminal of the service data drive unit, and a second end of the isolation inductor L1 is connected to the current sink interface of the monitoring current generation unit; and the isolation inductor L1 is used to isolate the service data electrical signal to avoid leakage.

3. The drive circuit of claim 1, wherein the monitoring data modulation unit comprises an inversion buffer U1 and a MOS transistor Q1; and an input terminal of the inversion buffer U1 is connected to the input terminal of the monitoring data modulation unit, an output terminal of the inversion buffer U1 is connected to a gate of the MOS transistor Q1, and a drain of the MOS transistor Q1 is connected to one input terminal of the monitoring current generation unit, and a source of the MOS transistor Q1 is grounded.

4. The drive circuit of claim 1, wherein the monitoring current generation unit comprises an operational amplifier U2, a MOS transistor Q2 and a resistor R1;

an output terminal of the operational amplifier U2 is connected to a gate of the MOS transistor Q2, a drain of the MOS transistor Q2 is configured as the current sink interface, a source of the MOS transistor Q2 is connected to a first end of the resistor R1, and a second end of the resistor R1 is grounded; and one of input terminals of the operational amplifier U2 is connected to the output terminals of the voltage configuration unit and the monitoring data modulation unit at the same time, and the other input terminal of the operational amplifier U2 is connected to the first end of the resistor R1.

5. The drive circuit of claim 1, wherein the voltage configuration unit comprises a voltage source VDAC, a resistor R2 and a resistor R3;

a positive electrode of the voltage source VDAC is connected to a first end of the resistor R2, a second end of the resistor R2 is connected to a first end of the resistor R3, and both a second end of the resistor R3 and a negative electrode of the voltage source VDAC are grounded; and the first end of the resistor R3 is connected to one input terminal of the monitoring current generation unit.

6. The drive circuit of claim 5, wherein the service data drive unit-comprises a transistor QA, a transistor QB and a current source Imod;

a base of the transistor QA is connected to a first input terminal of the service data drive unit, a collector of the transistor QA is connected to a first output terminal of the service data drive unit, an emitter of the transistor QA is connected to a first end of the current source Imod, and a second end of the current source Imod is grounded; and a base of the transistor QB is connected to a second input terminal of the service data drive unit, a collector of the transistor QB is connected to a second output terminal of the service data drive unit, and an emitter of the transistor QB is connected to the first end of the current source Imod.

7. The drive circuit of claim 6, wherein the service data drive unit-further comprises a voltage source Va, an inductor LA and a resistor RA; and a positive electrode of the voltage source Va is connected to a first end of the inductor LA, a negative electrode of the voltage source Va is grounded, a second end of the inductor LA is connected to the collector of the transistor QA, and a first end of the resistor RA is connected to the positive electrode of the voltage source Va, and a second end of the resistor RA is connected to the collector of the transistor QA.

8. The drive circuit of claim 7, wherein the service data drive unit-further comprises a voltage source Vb, an inductor LB and a resistor RB;

a positive electrode of the voltage source Vb is connected to a first end of the inductor LB, a negative electrode of the voltage source Vb is grounded, a second end of the inductor LB is connected to the collector of the transistor QB, and a first terminal of the resistor RB is connected to the positive electrode of the voltage source Vb, and a second terminal of the resistor RB is connected to the collector of the transistor QB.

9. The drive circuit of claim 5, wherein a signal rate of the service data is larger than 100 Mb/s, and a signal rate of the monitoring data is not larger than 500 kb/s.

10. A direct modulated optical transmitter, wherein the direct modulated optical transmitter comprises a direct modulated laser and a drive circuit, wherein the drive circuit comprises a service data drive unit, a voltage configuration unit, a monitoring data modulation unit and a monitoring current generation unit, output terminals of the voltage configuration unit and the monitoring data modulation unit are connected to a same input terminal of the monitoring current generation unit, and an output terminal of the service data drive unit is connected to a current sink interface of the monitoring current generation unit, and the output terminal of the service data drive unit is also suitable for connecting the direct modulated laser;

an input terminal of the service data drive unit is used for receiving a service data electrical signal, converting the service data electrical signal into a service data current signal, and then sending it to the direct modulated laser;

the voltage configuration unit is used to adjust a maximum value of an input voltage of the monitoring current generation unit;

an input terminal of the monitoring data modulation unit is used for receiving monitoring data, and modulating the monitoring data into a logic signal, wherein the logic signal and a voltage signal output by the voltage configuration unit constitute a control signal together;

the monitoring current generation unit is used to convert the control signal into a monitoring data current signal, and the monitoring data current signal flows through the direct modulated laser and then flows into the current sink interface to drive the direct modulated laser to emit light, so that the direct modulated laser outputs an optical signal aliased with the monitoring data and service data, thereby realizing remote monitoring; and the direct modulated laser is connected to the output terminal of the service data drive unit, and the direct modulated laser outputs an optical signal aliased with the monitoring data and the service data.

11. The drive circuit of claim 2, wherein the service data drive unit comprises a transistor QA, a transistor QB and a current source Imod;

a base of the transistor QA is connected to a first input terminal of the service data drive unit, a collector of the transistor QA is connected to a first output terminal of the service data drive unit, an emitter of the transistor QA is connected to a first end of the current source Imod, and a second end of the current source Imod is grounded; and a base of the transistor QB is connected to a second input terminal of the service data drive unit, a collector of the transistor QB is connected to a second output terminal of the service data drive unit, and an emitter of the transistor QB is connected to the first end of the current source Imod.

12. The drive circuit of claim 3, wherein the service data drive unit comprises a transistor QA, a transistor QB and a current source Imod;

a base of the transistor QA is connected to a first input terminal of the service data drive unit, a collector of transistor QA is connected to a first output terminal of the service data drive unit, an emitter of the transistor QA is connected to a first end of the current source Imod, and a second end of the current source Imod is grounded; and a base of the transistor QB is connected to a second input terminal of the service data drive unit, a collector of the transistor QB is connected to a second output terminal of the service data drive unit, and an emitter of the transistor QB is connected to the first end of the current source Imod.

13. The drive circuit of claim 4, wherein the service data drive unit comprises a transistor QA, a transistor QB and a current source Imod;

a base of the transistor QA is connected to a first input terminal of the service data drive unit, a collector of the transistor QA is connected to a first output terminal of the service data drive unit, an emitter of the transistor QA is connected to a first end of the current source Imod, and a second end of the current source Imod is grounded; and a base of the transistor QB is connected to a second input terminal of the service data drive unit, a collector of the transistor QB is connected to a second output terminal of the service data drive unit, and an emitter of the transistor QB is connected to the first end of the current source Imod.

14. The drive circuit of claim 1, wherein the service data drive unit comprises a transistor QA, a transistor QB and a current source Imod;

a base of the transistor QA is connected to a first input terminal of the service data drive unit, a collector of the transistor QA is connected to a first output terminal of the service data drive unit, an emitter of the transistor QA is connected to a first end of the current source Imod, and a second end of the current source Imod is grounded; and a base of the transistor QB is connected to a second input terminal of the service data drive unit, a collector of the transistor QB is connected to a second output terminal of the service data drive unit, and an emitter of the transistor QB is connected to the first end of the current source Imod.

15. The drive circuit of claim 2, wherein a signal rate of the service data is larger than 100 Mb/s, and a signal rate of the monitoring data is not larger than 500 kb/s.

16. The drive circuit of claim 3, wherein a signal rate of the service data is larger than 100 Mb/s, and a signal rate of the monitoring data is not larger than 500 kb/s.

17. The drive circuit of claim 4, wherein a signal rate of the service data is larger than 100 Mb/s, and a signal rate of the monitoring data is not larger than 500 kb/s.

18. The drive circuit of claim 1, wherein a signal rate of the service data is larger than 100 Mb/s, and a signal rate of the monitoring data is not larger than 500 kb/s.

* * * * *